United States Patent
Fukazawa

(10) Patent No.: US 7,208,831 B2
(45) Date of Patent: Apr. 24, 2007

(54) SEMICONDUCTOR DEVICE HAVING MULTILAYER WIRING STRUCTURE AND METHOD, WHEREIN CONNECTING PORTION AND WIRING LAYER ARE FORMED OF SAME LAYER

(75) Inventor: Yuji Fukazawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/755,003

(22) Filed: Jan. 8, 2004

(65) Prior Publication Data

US 2004/0140568 A1 Jul. 22, 2004

Related U.S. Application Data

(62) Division of application No. 09/882,435, filed on Jun. 15, 2001, now Pat. No. 6,693,028.

(30) Foreign Application Priority Data

Jun. 19, 2000 (JP) .............................. 2000-183194
May 9, 2001 (JP) .............................. 2001-138681

(51) Int. Cl.
*H01L 23/48* (2006.01)
*H01L 21/02* (2006.01)
*H01L 21/4763* (2006.01)

(52) U.S. Cl. .............................. 257/700; 257/E21.303; 257/E21.583; 257/E21.309; 257/701; 257/758; 257/751; 257/774; 257/775; 257/760; 257/776; 257/762; 257/276; 257/410; 257/254

(58) Field of Classification Search ........ 257/E21.303, 257/E21.583, E21.309, 700, 701, 758, 751, 257/774, 760, 775, 776, 762, 276, 410, 254, 257/750
See application file for complete search history.

(56) References Cited

U.S. PATENT DOCUMENTS

| | | | |
|---|---|---|---|
| 5,510,645 A * | 4/1996 | Fitch et al. .................. | 257/522 |
| 5,773,365 A | 6/1998 | Ito .............................. | 438/624 |
| 6,051,882 A * | 4/2000 | Avanzino et al. ........... | 257/760 |
| 6,232,215 B1 | 5/2001 | Yang .......................... | 438/622 |
| 6,346,438 B1 * | 2/2002 | Yagishita et al. ........... | 438/197 |
| 6,454,919 B1 * | 9/2002 | Sundarrajan et al. .. | 204/298.02 |
| 6,455,436 B1 | 9/2002 | Ueda et al. ................. | 438/706 |
| RE37,882 E * | 10/2002 | Ezawa et al. ............... | 438/107 |
| 6,461,955 B1 * | 10/2002 | Tsu et al. .................... | 438/618 |
| 6,492,222 B1 * | 12/2002 | Xing .......................... | 438/240 |
| 6,495,451 B2 * | 12/2002 | Hattori et al. .............. | 438/638 |

(Continued)

FOREIGN PATENT DOCUMENTS

| | | | |
|---|---|---|---|
| JP | 63-228736 | * | 9/1988 |
| JP | 09-321138 | | 12/1997 |
| JP | 10-313052 | | 11/1998 |
| JP | 11-121612 | | 4/1999 |

*Primary Examiner*—Alexander Oscar Williams
(74) *Attorney, Agent, or Firm*—Frommer Lawrence & Haug LLP

(57) ABSTRACT

A method for manufacturing a semiconductor device includes a step of forming a first groove in a first insulating film, forming a conductive film in the first groove, a step of selectively forming a second insulating film on the conductive film and the first insulating film, a step of forming a second groove by removing part of the conductive film using the second insulating film as a mask, the second groove being formed so as to form a connecting portion of the conductive film under the second insulating film and form a first wiring layer by forming the connecting portion with a bottom of the first groove integrally with each other as one unit.

12 Claims, 14 Drawing Sheets

U.S. PATENT DOCUMENTS

| | | | |
|---|---|---|---|
| 6,515,343 B1* | 2/2003 | Shroff et al. | 257/530 |
| 6,566,242 B1* | 5/2003 | Adams et al. | 438/622 |
| 6,787,907 B2* | 9/2004 | Watanabe et al. | 257/758 |
| 6,815,823 B2* | 11/2004 | Teh et al. | 257/758 |
| 2003/0143839 A1* | 7/2003 | Raaijmakers et al. | 438/633 |
| 2004/0043602 A1* | 3/2004 | Wada et al. | 438/631 |
| 2004/0185678 A1* | 9/2004 | Lee et al. | 438/780 |

* cited by examiner

SEMICONDUCTOR DEVICE HAVING MULTILAYER WIRING STRUCTURE AND METHOD, WHEREIN CONNECTING PORTION AND WIRING LAYER ARE FORMED OF SAME LAYER

CROSS-REFERENCE TO RELATED APPLICATIONS

This application is a divisional of U.S. patent application Ser. No. 09/882,435, filed Jun. 15, 2001, now U.S. Pat. No. 6,693,028, the entire contents of which are incorporated by reference, and which is based upon and claims the benefit of priority from the prior Japanese Patent Applications No. 2000-183194, filed Jun. 19, 2000; and No. 2001-138681, filed May 9, 2001, the entire contents of which are incorporated by reference.

BACKGROUND OF THE INVENTION

The present invention relates to a semiconductor device having a multilayer wiring structure using copper and a method for manufacturing the semiconductor device.

Recently a semiconductor device with a dual-damascene structure has been provided in which copper wiring is employed as a multilayer-wiring layer.

FIGS. 22 to 26 are cross-sectional views each showing a prior art step of manufacturing a semiconductor device. A method for forming copper wiring in a dual-damascene structure will be described below with reference to FIGS. 22 to 26.

As shown in FIG. 22, a first wiring groove 62 is first formed in a first insulating film 61 and then a conductive film 63a such as a copper film is formed on the first insulating film 61 by electrolytic plating, with the result that the first wiring groove 62 is filled with the conductive film 63a. The conductive film 63a is flattened by CMP (Chemical Mechanical Polishing) and the surface of the first insulating film 61 is exposed. Consequently, a first wiring layer 63 is formed in the first insulating film 61.

As illustrated in FIG. 23, a second insulating film 64 is formed on the first insulating film 61 and the first wiring layer 63. A via hole 65 and a second wiring groove 66 are formed in the second insulating film 64 by lithography and dry etching.

Referring to FIG. 24, a barrier metal layer 67 having a thickness of 200 Å is formed on the second insulating film 64 and the first wiring layer 63, and a metal seed layer (not shown) having a thickness of 400 Å is formed on the barrier metal layer 67. Then, a conductive film 68 is formed on the metal seed layer by electrolytic plating, and the via hole 65 and second wiring groove 66 are filled with the conductive film 68.

As shown in FIG. 25, the conductive film 68, metal seed layer, and barrier metal layer 67 are flattened by CMP to expose the surface of the second insulating film 64. As a result, a via section 69 and a second wiring layer 70 that are electrically connected to the first wiring 63 are formed.

However, the via hole 65 decreases in size in accordance with miniaturization of elements and thus the conductive film 68 cannot sufficiently be buried into the via hole 65 from top to bottom. As a result, a void 71 is formed in the via hole 65 to cause faulty electrical continuity between the first wiring 69 and the via section 69, as illustrated in FIG. 26. If the opening of the via section 69 is smaller than the second wiring layer 70, the conductive film 68 becomes more difficult to bury. The void 71 is therefore easily formed in the via hole 65 to make a problem of the faulty electrical continuity more serious.

BRIEF SUMMARY OF THE INVENTION

The present invention has been developed in order to resolve the above problem. An object of the present invention is to provide a semiconductor device capable of avoiding faulty electrical continuity between wiring and a via section, and a method for manufacturing the semiconductor device.

In order to attain the above object, the present invention employs the following means:

A method for manufacturing a semiconductor device according to a first aspect of the present invention, comprises the steps of forming a first insulating film; forming a first groove in the first insulating film; forming a conductive film in the first groove, selectively forming a second insulating film on the conductive film and the first insulating film, the second insulating film being formed so as to form a first region in which the second insulating film covers a surface of the conductive film and a second region in which the second insulating film does not cover the surface of the conductive film; forming a second groove by removing part of the conductive film of the second region using the second insulating film as a mask, the second groove being formed so as to form a connecting portion of the conductive film under the second insulating film and form a first wiring layer by forming the connecting portion with a bottom of the first groove integrally with each other as one unit; removing the second insulating film; forming a third insulating film in the second groove; and forming a second wiring layer electrically connected to the first wiring layer through the connecting portion.

The method according to the first aspect further comprises the steps of forming the third insulating film on the second insulating film and in the second groove, leaving the second insulating film, after the connecting portion and the first wiring layer are formed; removing the third insulating film until a surface of the second insulating film is exposed; removing the third insulating film such that the second groove and a periphery of the second insulating film are filled with the third insulating film; forming a third groove in the third insulating film so as to expose a surface of the connecting portion by removing the second insulating film with the exposed surface; and forming the second wiring layer in the third groove.

A method for manufacturing a semiconductor device according to a second aspect of the present invention, comprises the steps of forming a first insulating film; forming a second insulating film on the first insulating film; forming a third insulating film on the second insulating film; forming a first groove in the first, second and third insulating films; forming a conductive film in the first groove; selectively forming a fourth insulating film on the conductive film and the third insulating film, the fourth insulating film being selectively formed so as to form a first region in which the fourth insulating film covers a surface of the conductive film and a second region in which the fourth insulating film does not cover the surface of the conductive film; removing the conductive film of the second region using the fourth insulating film as a mask, the conductive film being removed so as to form a connecting portion of the conductive film under the fourth insulating film and form a first wiring layer by forming the connecting portion with a bottom of the first groove integrally with each other as one unit; removing the third and fourth insulating films to expose a surface of the second insulating film; forming a fifth insulating film on the second insulating film with the exposed surface and on the first wiring layer; and forming a second wiring layer electrically connected to the first wiring layer through the connecting portion.

A semiconductor device according to a third aspect of the present invention comprises a first wiring layer; a second wiring layer formed above the first wiring layer; and a connecting portion for electrically connecting the first and second wiring layers, the connecting portion being formed integrally with the first wiring layer as one unit, and a boundary between a side of the connecting portion and a surface of the first wiring layer being curved.

In the semiconductor device according to the third aspect, the surface of the first wiring layer and the side of the connecting portion are removed by wet etching. The connecting portion has an opening with dimensions smaller than minimum process dimensions.

According to the semiconductor device and its manufacturing method described above, faulty electrical continuity between the wiring layer and the via section can be avoided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
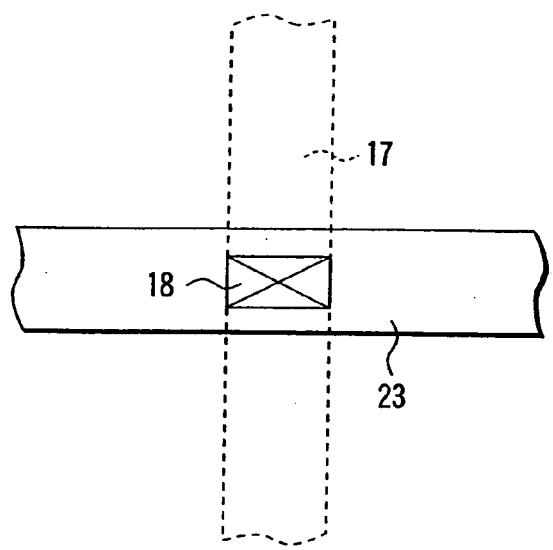
FIG. 1A is a plan view of a semiconductor device according to a first embodiment of the present invention.

Embodiments of the present invention will now be described with reference to the accompanying drawings. In the drawings, a region taken along line P—P is a via forming region and a region taken along line Q—Q is a wiring forming region.

[First Embodiment]

The first embodiment is characterized in that a first wiring layer and a via section are formed integrally as one unit by removing part of a conductive film buried into a first groove.

Figure 1B:
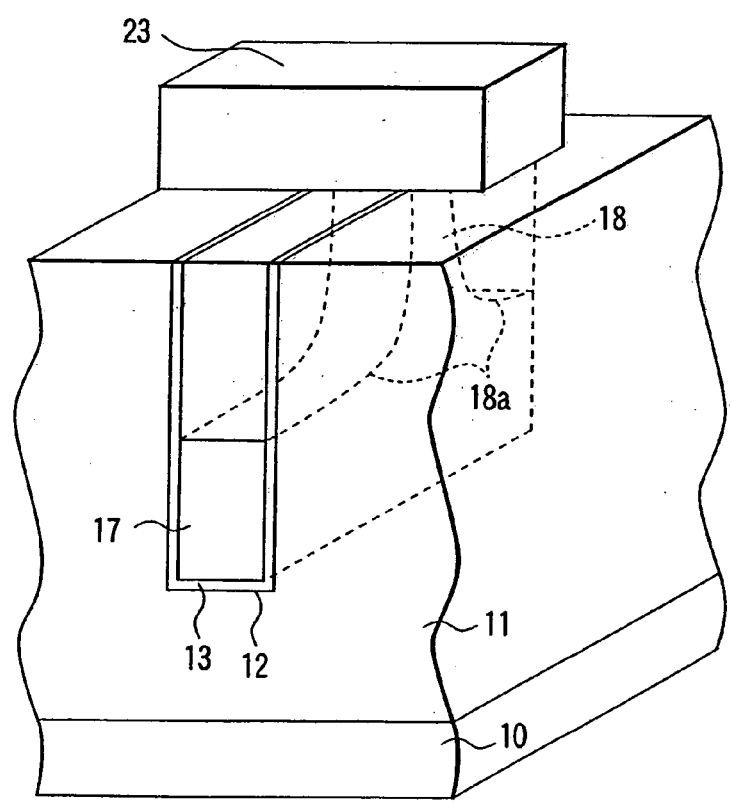
FIG. 1B is a perspective view of the semiconductor device according to the first embodiment of the present invention.

FIG. 1A is a plan view of a semiconductor device according to the first embodiment of the present invention and FIG. 1B is a perspective view of the semiconductor device.

As shown in FIG. 1A, a second wiring layer 23 is formed opposite to a first wiring layer 17, and a via section 18 is formed in a region crossing the first and second wiring layers 17 and 23 to electrically connect the wiring layers 17 and 23 with each other.

As illustrated in FIG. 1B, a first insulating film 11 is formed on a semiconductor substrate 10 and a groove 12 is formed in the first insulating film 11. The first wiring layer 17 is formed in the groove 12 with a barrier metal layer 13 interposed therebetween, and the first wiring layer 17 and the via section 18 are formed integrally as one unit. The second wiring layer 23 is formed on the via section 18 and electrically connected to the first wiring layer 17 through the via section 18.

Since the side of the via section 18 and the surface of the first wiring layer 17 are removed by wet etching, a boundary 18a between the side of the via section 18 and the surface of the first wiring layer 17 is curved along a curvature radius. The opening of the via section 18 is processed with dimensions smaller than the minimum dimensions F.

Figure 4:
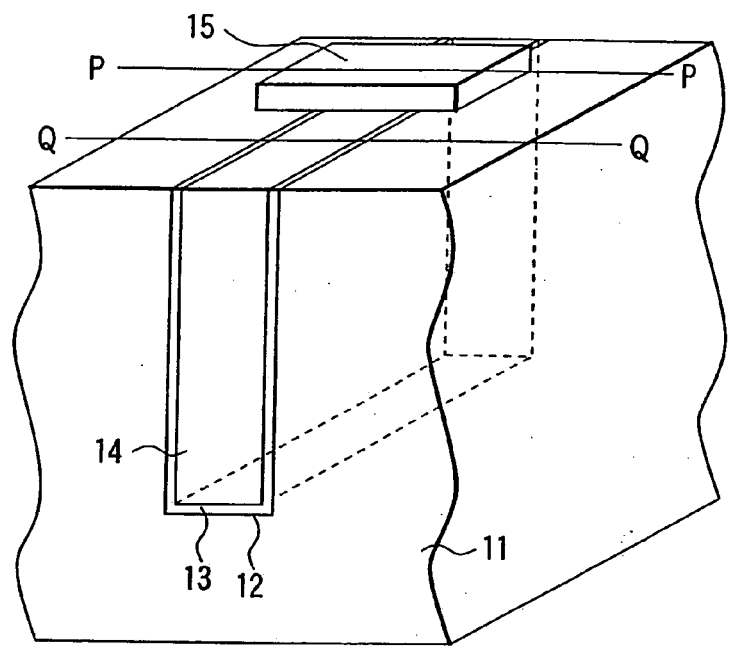
Figure 5:
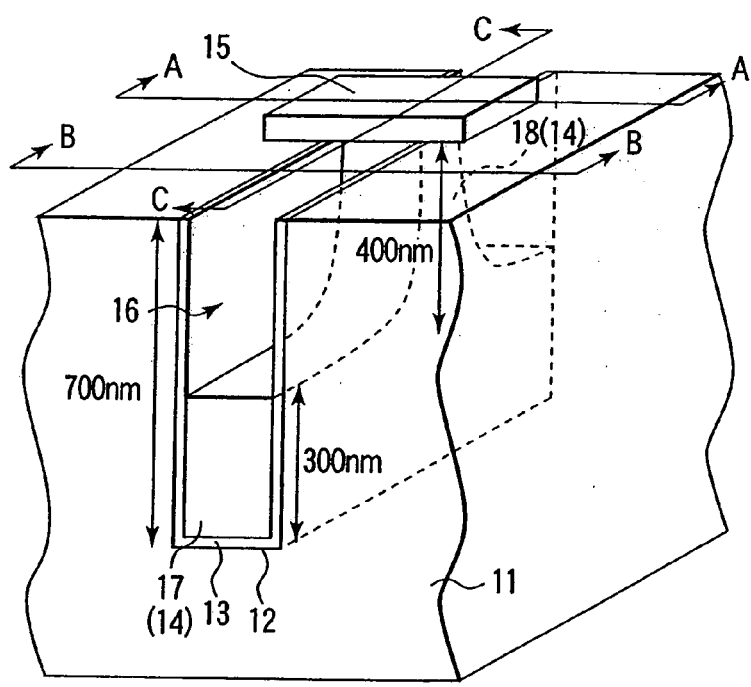
Figure 6:
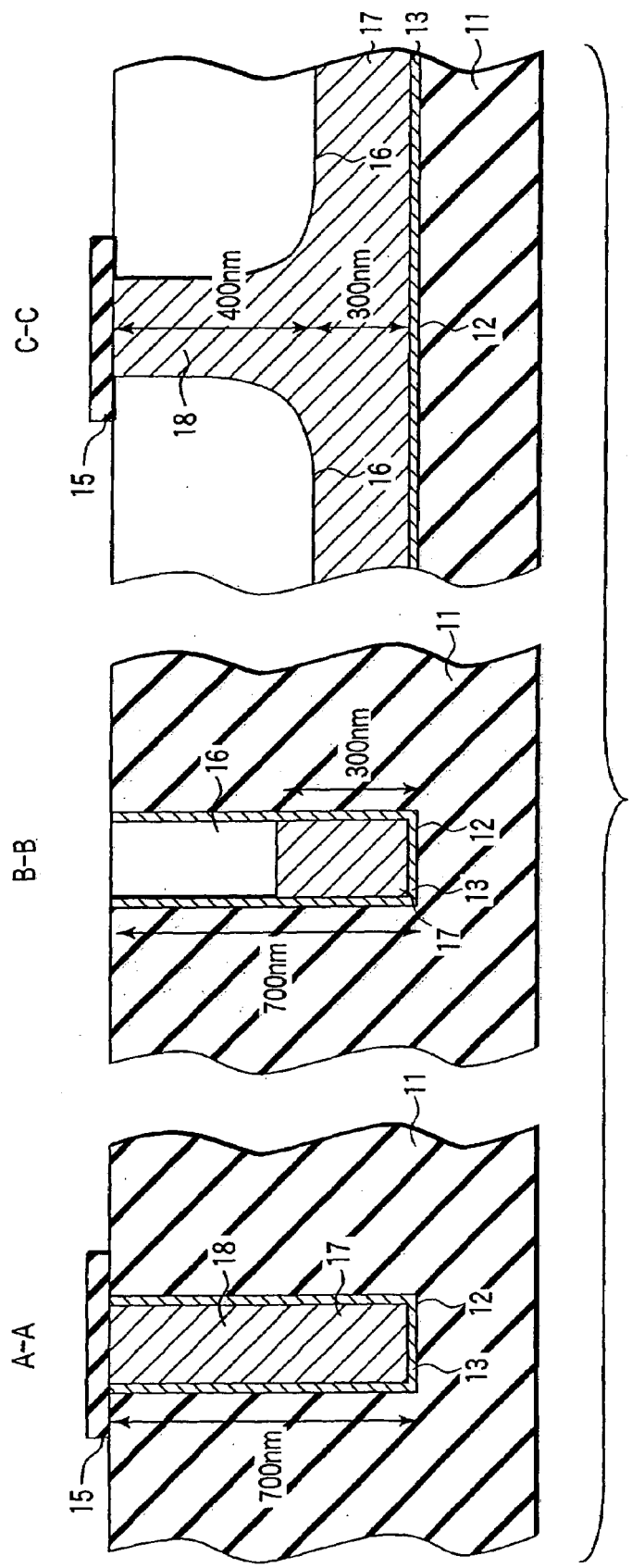
FIG. 6 includes cross-sectional views of the semiconductor device, which are taken along lines A—A, B—B and C—C of FIG. 5, respectively.
Figure 7:
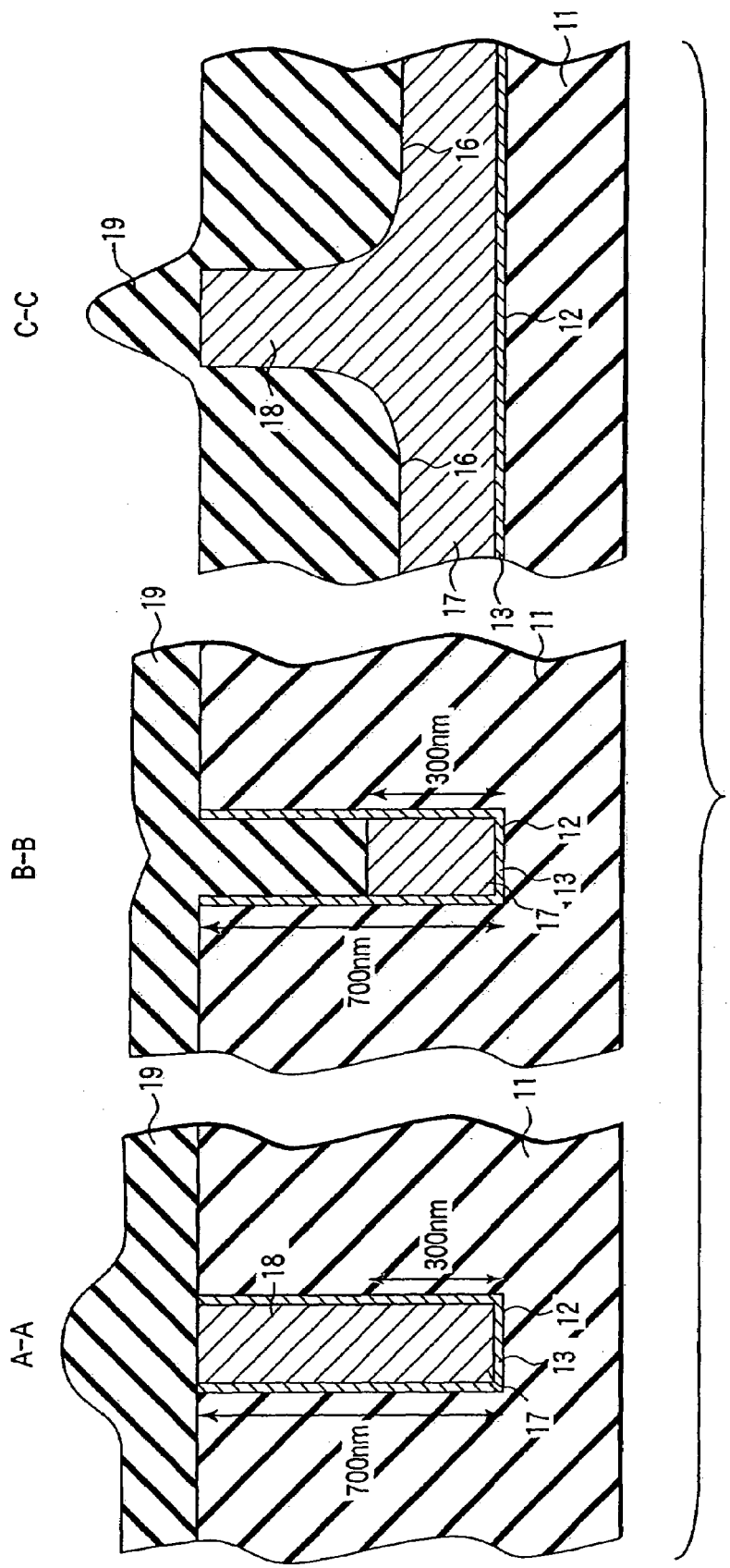
FIG. 7 includes cross-sectional views showing steps of manufacturing the semiconductor device according to the first embodiment of the present invention, which are subsequent to the steps shown in FIG. 6, respectively.
Figure 8:
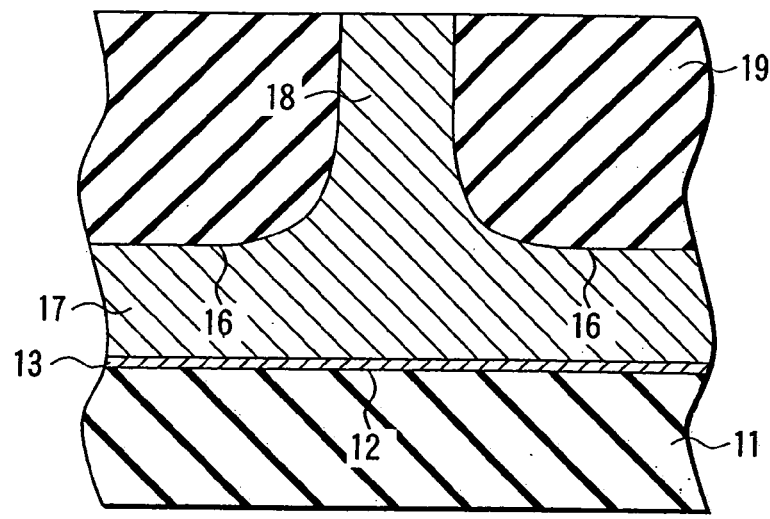
FIG. 8 is a cross-sectional view showing a step of manufacturing the semiconductor device according to the first embodiment of the present invention, which is subsequent to the step shown in C—C region of FIG. 7.
Figure 9:
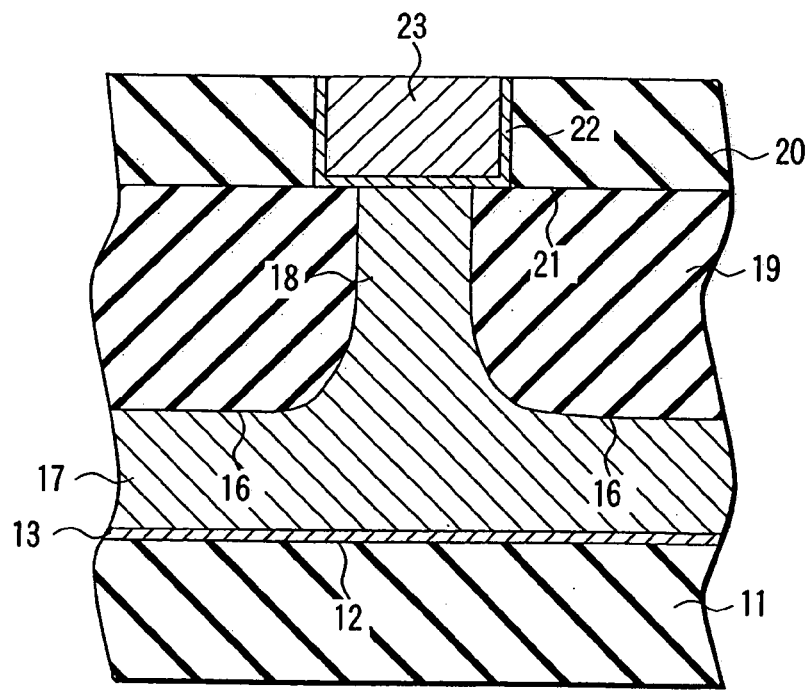
FIG. 9 is a cross-sectional view showing a step of manufacturing the semiconductor device according to the first embodiment of the present invention, which is subsequent to the step shown in FIG. 8.

FIGS. 2 to 9 are perspective views each showing a step of manufacturing the semiconductor device according to the first embodiment. A—A, B—B, and C—C regions of FIG. 6 are cross-sectional views of the semiconductor device that are taken along lines A—A, B—B, and C—C of FIG. 5. FIG. 7 includes cross-sectional views of manufacturing steps subsequent to those of FIG. 6. FIGS. 8 and 9 are cross-sectional views of manufacturing steps subsequent to that of C—C region of FIG. 7. A method for manufacturing the semiconductor device according to the first embodiment will now be described.

Figure 2:
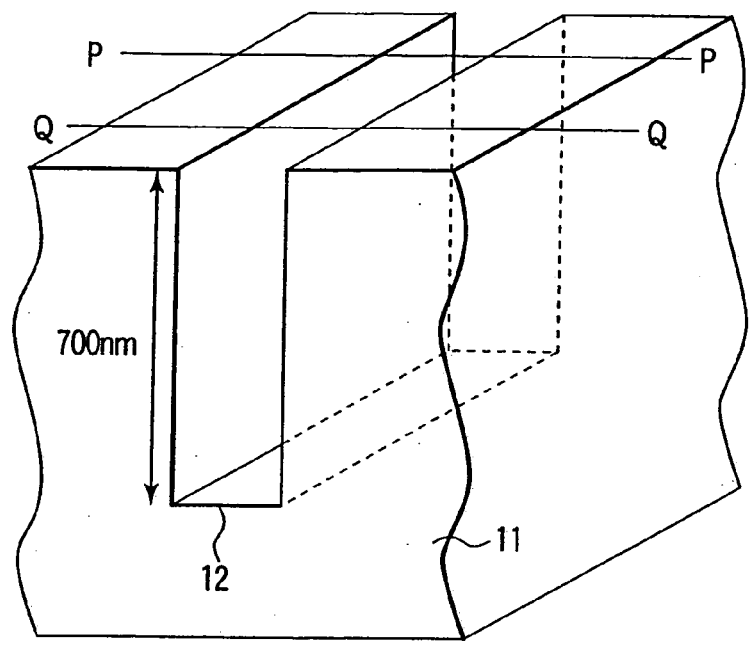
FIGS. 2, 3, 4 and 5 are perspective views each showing a step of manufacturing the semiconductor device according to the first embodiment of the present invention.

As FIG. 2 shows, a first insulating film (e.g., an oxide film) 11 having a thickness of 1000 nm is formed on a semiconductor substrate (not shown) on which a semiconductor element is formed. A resist film (not shown) is formed on the first insulating film 11 and patterned by lithography. Using the patterned resist film as a mask, the first insulating film 11 is removed by dry etching. A first groove 12 is thus formed in the first insulating film 11. The depth of the first groove 12 is 700 nm and corresponds to the total of the thickness of a first wiring layer and the depth of a via section, which will be described later.

Figure 3:
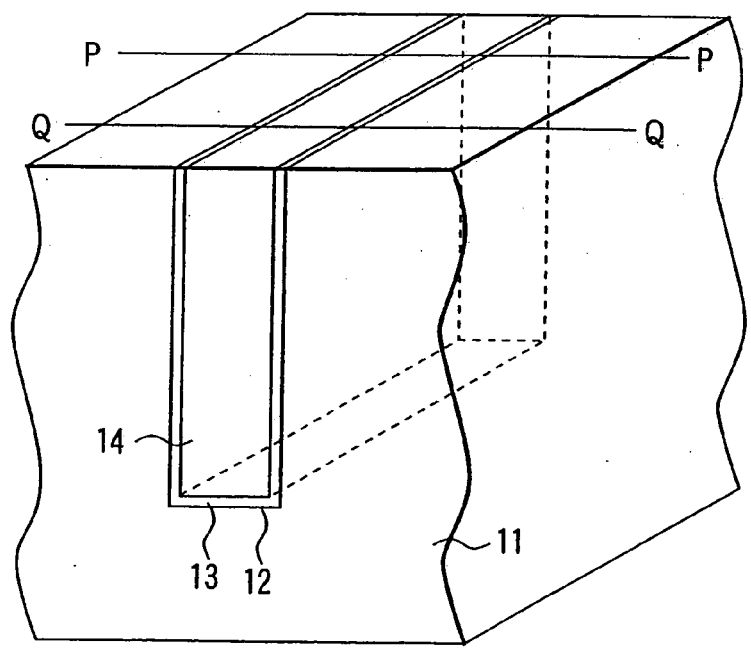

As shown in FIG. 3, a barrier metal layer (e.g., a TaN film) 13 is formed on the first insulating film 11 by sputtering, and a metal seed layer (not shown) containing copper is formed on the barrier metal layer 13. The thickness of the barrier metal layer 13 is 20 nm and that of the metal seed layer is 40 nm.

A conductive film 14 such as a copper film is formed on the metal seed layer by electrolytic plating and buried into the first groove 12. After that, the conductive film 14, metal seed layer and barrier metal layer 13 are flattened by CMP (Chemical Mechanical. Polishing). The surface of the first insulating film 11 is exposed.

Referring to FIG. 4, a second insulating film (e.g., a SiN film) 15 having a thickness of 20 nm is formed on the first insulating film 11, conductive film 14, metal seed layer, and barrier metal layer 13 by CVD (Chemical Vapor Deposition). A resist film (not shown) is formed on the second insulating film 15 and then patterned by lithography so as to remain in a via forming region. Using the patterned resist film as a mask, the second insulating film 15 is removed by dry etching. The patterned second insulating film 15 is therefore formed on the via forming region. In other words, there are a region from which the surface of the conductive film 14 is not exposed since the region is covered with the patterned second insulating film 15 and a region from which the surface of the conductive film 14 is exposed since the region is not covered with the patterned second insulating film 15.

As FIG. 5 illustrates, using the second insulating film 15 as a mask, the conductive film 14 at least the surface of which is exposed is removed so as to leave the conductive film 14 having a thickness of 300 nm from the bottom of the first groove 12, thereby forming a second groove 16. Consequently, a first wiring layer 17 having a thickness of 300 nm is formed in the wiring forming region, and a via section 18 is formed to a depth of 400 nm in the via forming region.

The first wiring layer 17 and the via section 18 are formed integrally as one unit by means of the conductive film 14, as shown in FIG. 6.

The conductive film 14 can be removed by wet etching, dry etching, CDE (Chemical Dry Etching), or the like. However, the dry etching is the most desirable method. If the conductive film 14 is removed by wet etching, a mixed solution of hydrochloric acid (2.5%) and hydrogen peroxide (2.5%) is used. The etching rate of the conductive film 14 varies with temperatures and it is about 1500 Å/M at room temperatures.

As shown in FIG. 7, the second insulating film 15 is removed by CDE and then a third insulating film 19 is formed on the first insulating film 11, first wiring layer 17, via section 18, metal seed layer, and barrier metal layer 13 using plasma. Consequently, the second groove 16 is filled with the third insulating film 19, and the via section 18 is covered with the third insulating film 19. The third insulating film 19 can be formed of an oxide film, a CVD film containing fluorine, a coating oxide film such as an SOG (Spin On Glass) film, or an organic film.

As shown in FIG. 8, the third insulating film 19 is flattened by CMP and the surface of the via section 18 is exposed.

As illustrated in FIG. 9, a fourth insulating film 20 is formed on the third insulating film 19 and the via section 18. A third groove 21 is formed in the fourth insulating film 20 so as to expose the surface of the via section 18. After that, a second wiring layer 23 is formed in the third groove 21 with a barrier metal layer (e.g., a TiN film) 22 interposed therebetween. The second wiring layer 23 is electrically connected to the first wiring layer 17 through the via section 18.

According to the first embodiment described above, the first wiring layer 17 and the via section 18 are formed by patterning the conductive film 14 buried into the first groove 12. Thus, a step of burying the conductive film into the groove shaped like the via section 18 can be eliminated. Since, therefore, a void can be prevented from being formed due to a poor burial of the conductive film as in the prior art, faulty electrical continuity between the first wiring layer 17 and the via section 18 can be avoided.

The first wiring layer 17 and the via section 18 are formed simultaneously and integrally as one unit. In other words, the via section 18 is not formed simultaneously and integrally with the second wiring layer 23, unlike in the prior art semiconductor device. When the via section 18 is formed, its opening area does not depend upon the second wiring layer 23. The opening of the via section 18 formed in the second wiring layer 23 can sufficiently be decreased in size. More specifically, the via section 18 is formed by removing part of the conductive film 14, so that it can be processed with dimensions smaller than the minimum dimensions F. According to the first embodiment described above, the very small via section 18 can be formed without causing any void.

Wet etching is used in the step of removing the conductive film 14 shown in FIG. 5. The opening of the via section 18 can thus be decreased in size and the element can be miniaturized accordingly.

Since the first wiring 17 and via section 18 are formed by wet etching, a boundary 18*a* between the side of the via section 18 and the surface of the first wiring layer 17 is curved. The concentration of electric fields on the curved boundary 18*a* can thus be mitigated more than when the boundary 18*a* is folded at right angles.

The third insulating film 19 can be formed of materials other than those of the first insulating film 11. Therefore, the insulating capacitance between wiring layers and between layers can freely be controlled.

The second embodiment is not limited to the fact that the second insulating film 15 is removed before the third insulating film 19 is formed. For example, the third insulating film 19 can be formed leaving the second insulating film 15 as it is, and the second insulating film 15 can be removed at the same time when the third insulating film 19 is flattened as shown in FIG. 8.

[Second Embodiment]

The second embodiment of the present invention is characterized in that the depth of a via section is controlled by forming a multilevel first wiring layer and a multilevel insulating film around the via section.

Figure 11:
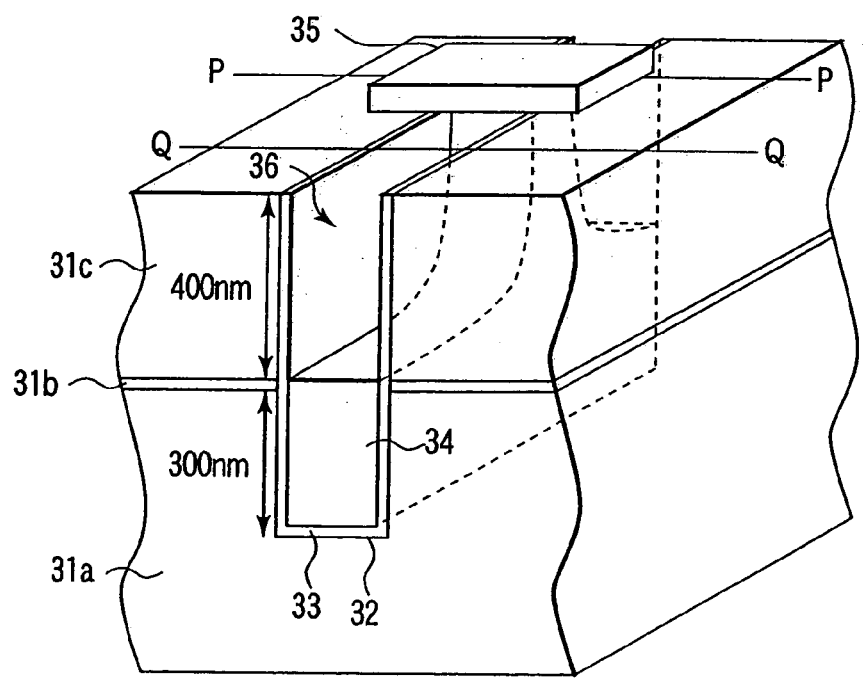
Figure 12:
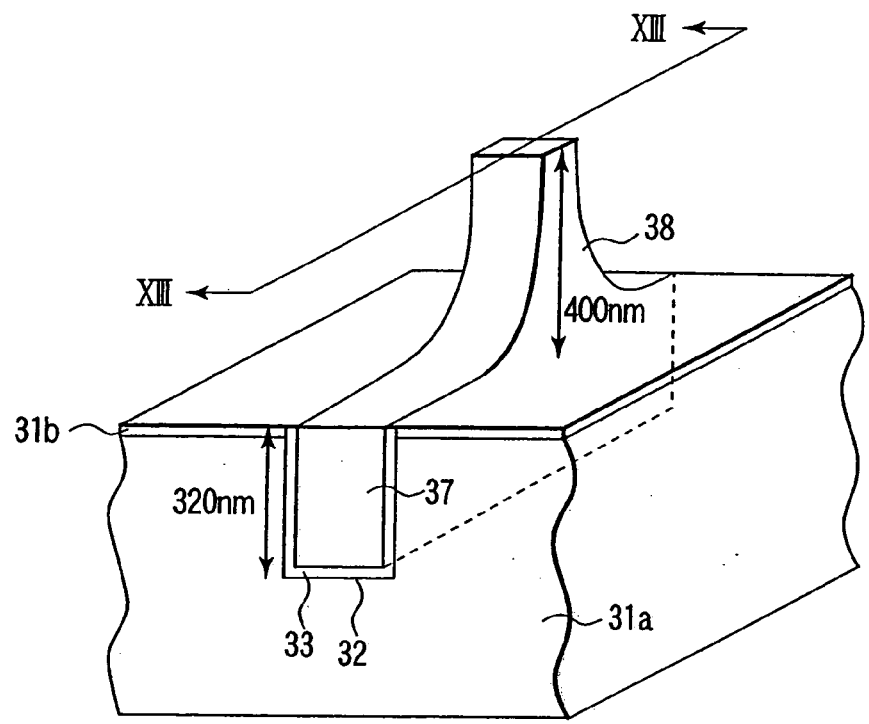
Figure 13:
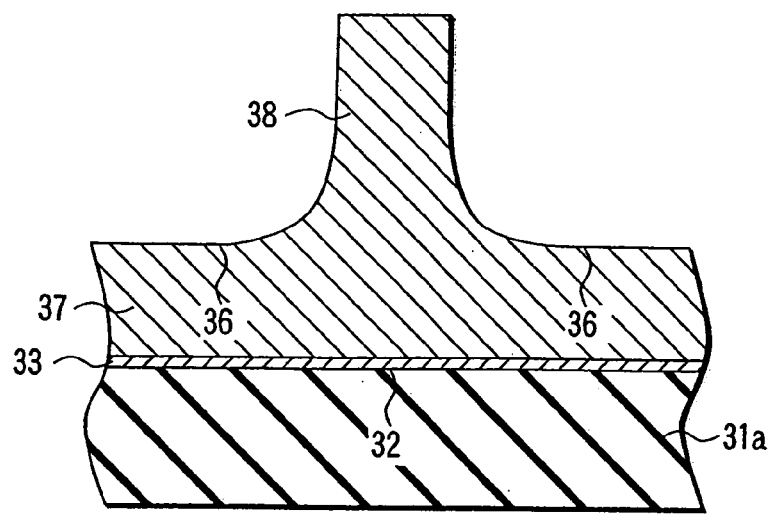
FIG. 13 is a cross-sectional view of the semiconductor device taken along line XIII—XIII of FIG. 12.

FIGS. 10 to 15 are perspective views each showing a step of manufacturing a semiconductor device according to the second embodiment. FIG. 13 is a cross-sectional view of the semiconductor device taken along line XIII—XIII of FIG. 12. A method for manufacturing the semiconductor device of the second embodiment will now be described.

Figure 10:
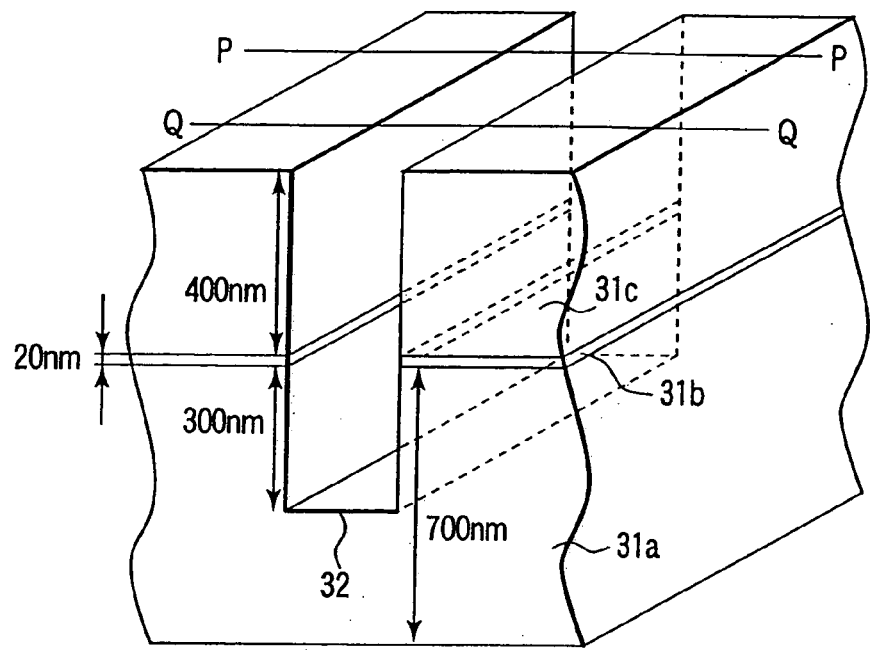
FIGS. 10, 11 and 12 are perspective views each showing a step of manufacturing a semiconductor device according to a second embodiment of the present invention.

As illustrated in FIG. 10, a first insulating film (e.g., an oxide film) 31a having a thickness of 700 nm is formed by CVD on a semiconductor substrate (not shown) on which a semiconductor element is formed. A second insulating film (e.g., a nitride film) 31b having a thickness of 20 nm is formed on the first insulating film 31a. A third insulating film (e.g., an oxide film) 31c having a thickness of 400 nm is formed on the second insulating film 31b. The second insulating film 31b is formed to make the thickness of a first wiring layer (described later) constant.

A resist film (not shown) is formed on the third insulating film 31c and patterned by lithography. Using the patterned resist film as a mask, part of the first insulating film 31a and all of the second and third insulating films 31b and 31c are removed by dry etching. A first groove 32 is therefore formed in the first, second and third insulating films 31a, 31b and 31c. The depth from the surface of the first insulating film 31a to the bottom of the first groove 32 is 300 nm. The total of the depth and the thickness of the second insulating film 31b corresponds to the thickness of the first wiring layer.

As FIG. 11 illustrates, a barrier metal layer (e.g., a TaN film) 33 is formed on the first and third insulating films 31a and 31c by sputtering. A metal seed layer (not shown) containing copper is formed on the barrier metal layer 33. The thickness of the barrier metal layer 33 is 20 nm and that of the metal seed layer is 40 nm.

A conductive film 34 such as a copper film is formed on the metal seed layer by electrolytic plating and buried into the first groove 32. After that, the conductive film 34, metal seed layer and barrier metal layer 33 are flattened by CMP. The surface of the third insulating film 31c is exposed.

A fourth insulating film (e.g., a SiN film) 35 having a thickness of 20 nm is formed by CVD on the third insulating film 31c, barrier metal layer 33, metal seed layer and conductive film 34. A resist film (not shown) is formed on the fourth insulating film 35 and then patterned by lithography so as to remain in a via forming region. Using the patterned resist film as a mask, the fourth insulating film 35 is removed by dry etching. The patterned fourth insulating film 35 is therefore formed on the via forming region. In other words, there are a region from which the surface of the conductive film 34 is not exposed since the region is covered with the patterned fourth insulating film 35 and a region from which the surface of the conductive film 34 is exposed since the region is not covered with the patterned fourth insulating film 35.

Using the patterned fourth insulating film 35 as a mask, the conductive film 34 is removed to the surface of the second insulating film 31b. A second groove 36 having a depth of 400 nm is formed. The conductive film 34 can be removed by any of wet etching, dry etching, and CDE as in the first embodiment.

As shown in FIG. 12, the third and fourth insulating films 31c and 35 are removed using the second insulating film 31b as a stopper, thereby exposing the surface of the second insulating film 31b. The third insulating film 31c is removed by hydrofluoric acid (HF: 1% solution). The fourth, insulating film 35 is removed by HF.

Thus, a first wiring layer 37 having a thickness of 320 nm is formed in the wiring forming region, while a via section 38 having a depth of 400 nm is formed in the via forming region. As shown in FIG. 13, the via section 38, which is projected, is formed integrally with the first wiring layer 37 as one unit.

Figure 14:
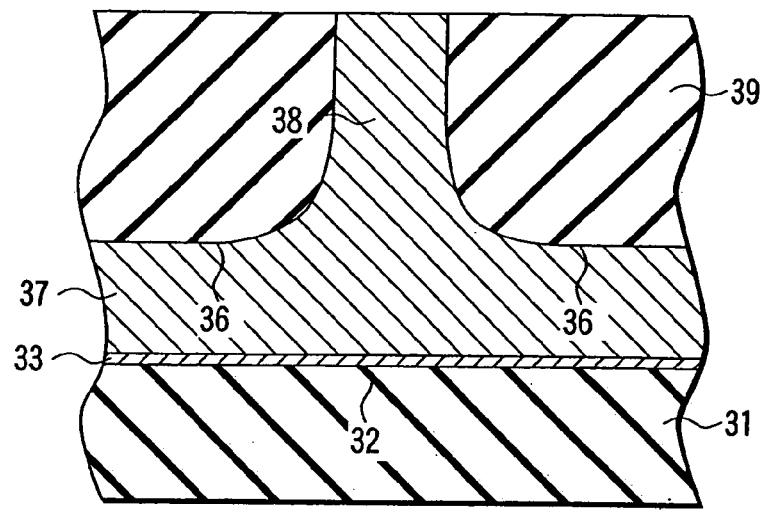
FIG. 14 is a cross-sectional view showing a step of manufacturing the semiconductor device according to the second embodiment of the present invention, which is subsequent to the step shown in FIG. 13.

As FIG. 14 illustrates, a fifth insulating film 39 is formed on the second insulating film 31b, the first wiring layer 37 and the via section 38. The fifth insulating film 39 is buried into the second groove 36 to cover the via section 38. As the fifth insulating film 39, a CVD film containing fluorine, a coating oxide film such as an SOG film, or an organic film can be used. After that, the fifth insulating film 39 is flattened by CMP and the surface of the via section 38 is exposed.

Figure 15:
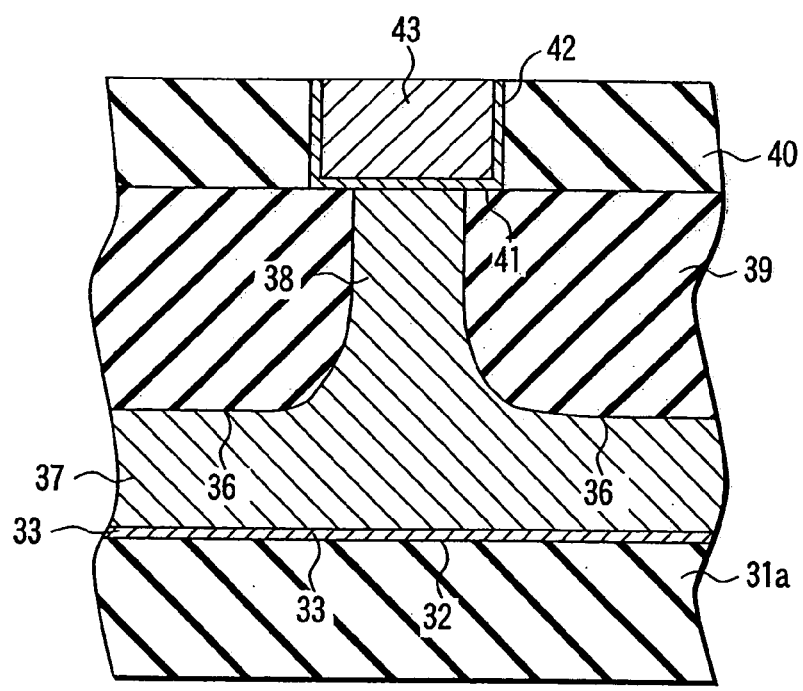
FIG. 15 is a cross-sectional view showing a step of manufacturing the semiconductor device according to the second embodiment of the present invention, which is subsequent to the step shown in FIG. 14.

As FIG. 15 shows, a sixth insulating film 40 is formed on the fifth insulating film 39 and the via section 38, and a third groove 41 is formed in the sixth insulating film 40 so as to expose the surface of the via section 38. After that, a second wiring layer 43 is formed in the third groove 41 with a barrier metal layer 42 interposed therebetween. Consequently, the second wiring layer 43 is electrically connected to the first wiring layer 37 through the via section 38.

The foregoing second embodiment can produce the same advantage as that of the first embodiment.

Moreover, a three-layer structure of the insulating films 31a, 31b and 39 is formed around the first wiring layer 37 and the via section 38. It is therefore possible to remove the conductive film 34 using the second insulating film 31b as a stopper. Since the depth to which the conductive film 34 is removed can be controlled by the second insulating film 31b, the depth of the via section 38 can easily be controlled.

[Third Embodiment]

The third embodiment is characterized in that a second insulating film, which is used as a mask in forming both a via section and a first wiring layer, is used as a dummy pattern for forming a second wiring layer.

Figure 16:
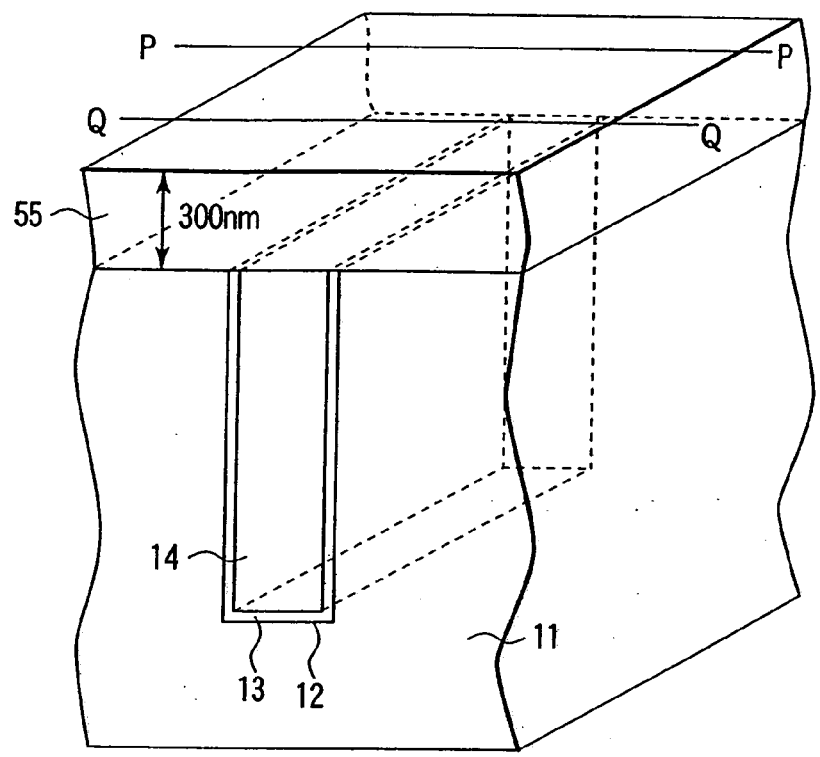
FIGS. 16 and 17 are perspective views each showing a step of manufacturing a semiconductor device according to a third embodiment of the present invention.
Figure 17:
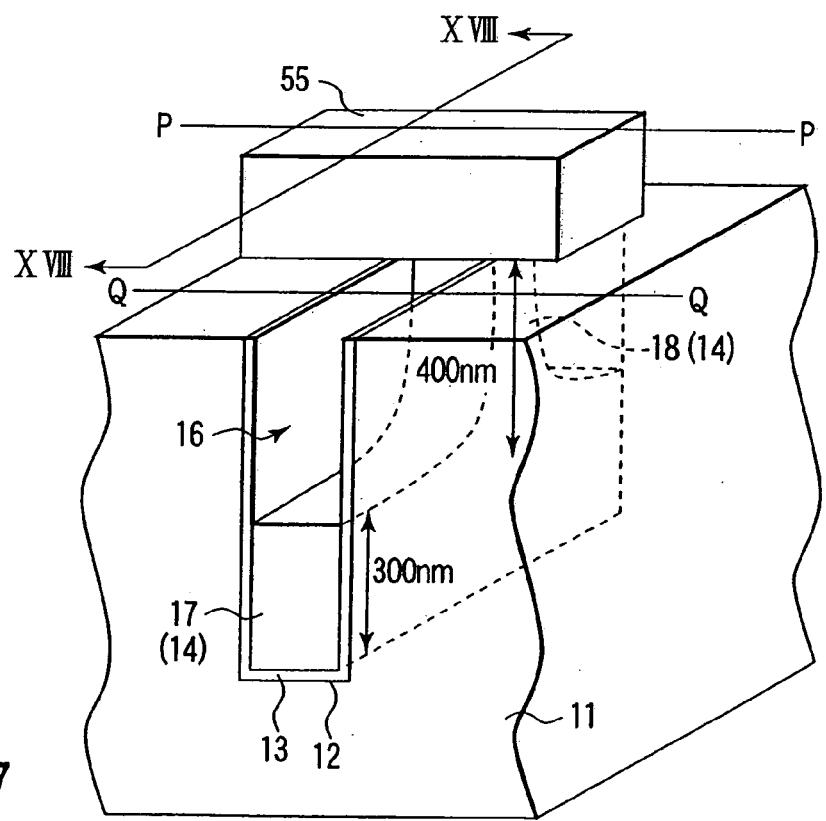
Figure 18:
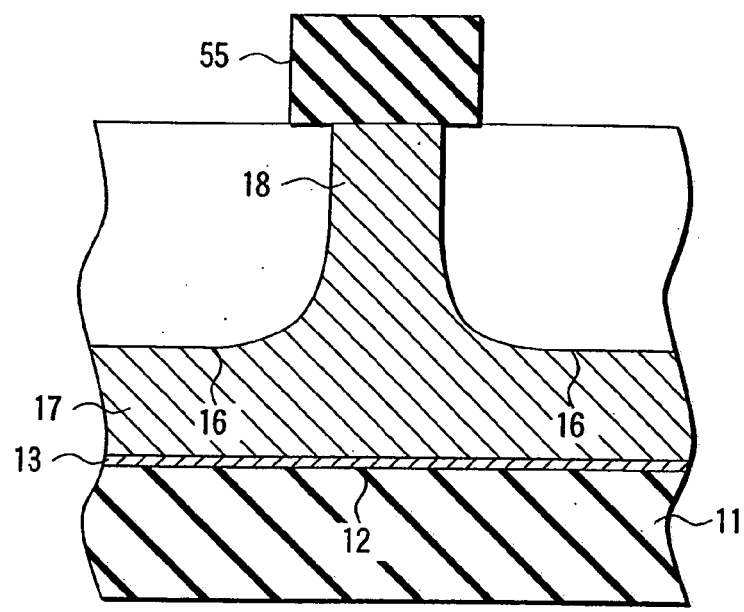
FIG. 18 is a cross-sectional view of the semiconductor device taken along line XVIII—XVIII of FIG. 17.

FIGS. 16 to 21 are perspective views each showing a step of manufacturing a semiconductor device according to the third embodiment. FIG. 18 is a cross-sectional view of the semiconductor device taken along line XVIII—XVIII of FIG. 17. A method for manufacturing the semiconductor device of the third embodiment will now be described. In the third embodiment, descriptions of the same steps as those of the first embodiment are omitted, and only different steps will be described.

Referring to FIGS. 2 to 3, as in the first embodiment, a first groove 12 is formed in a first insulating film 11 and filled with a conductive film 14 such as a copper film with a barrier metal layer 13 interposed therebetween. After that, the conductive film 14, metal seed layer and barrier metal layer 13 are flattened and the surface of the first insulating film 11 is exposed.

As FIG. 16 illustrates, a second insulating film 55 having a thickness of 300 nm is formed on the first insulating film 11, conductive film 14, metal seed layer and barrier metal layer 13 by CVD. When the first insulating film 11 is a TEOS (Tetra Ethyl Orso Silicate) film, the second insulating film 55 can be formed of a coating film such as an SOG film. It is thus desirable that the second insulating film 55 be formed of materials other than those of the first insulating film 11. This aims at selectively and easily removing the second insulating film 55 from the first insulating film 11 before a second wiring layer (described later) is formed.

As FIG. 17 shows, a resist film (not shown) is formed on the second insulating film 55 and then patterned by lithography so as to remain in a via forming region. Using the patterned resist film as a mask, the second insulating film 55 is removed by dry etching. The patterned second insulating film 55 is therefore formed on the via forming region. In other words, there are a region from which the surface of the conductive film 14 is not exposed since the region is covered with the patterned second insulating film 55 and a region from which the surface of the conductive film 14 is exposed since the region is not covered with the patterned second insulating film 55. The patterned second insulating film 55 serves as a dummy pattern of the second wiring layer (described later).

Using the patterned second insulating film 55 as a mask, the conductive film 14 at least the surface of which is exposed is removed so as to leave the conductive film 14 having a thickness of 300 nm from the bottom of the first groove 12, thereby forming a second groove 16. Consequently, a first wiring layer 17 having a thickness of 300 nm is formed in the wiring forming region, and a via section 18 is formed to a depth of 400 nm in the via forming region.

As shown in FIG. 18, the via section 18 is formed integrally with the first wiring layer 17 as one unit.

Figure 19:
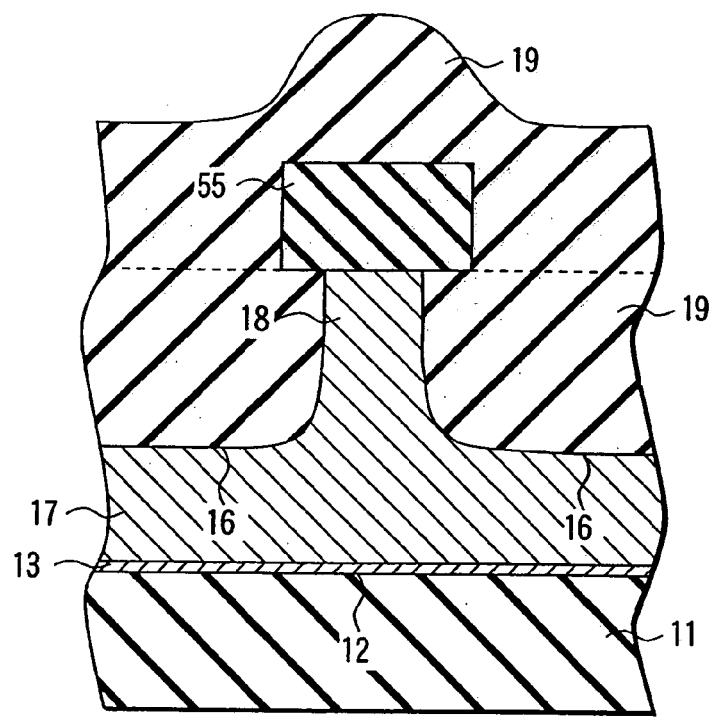
FIG. 19 is a cross-sectional view showing a step of manufacturing the semiconductor device according to the third embodiment of the present invention, which is subsequent to the step shown in FIG. 18.

Referring to FIG. 19, a third insulating film (e.g., an oxide film) 19 is formed on the first wiring layer 17 and via section 18 using plasma, leaving the second insulating film 55 as it is. Thus, the third insulating film 19 is buried into the second groove 16 to cover the second insulating film 55.

Figure 20:
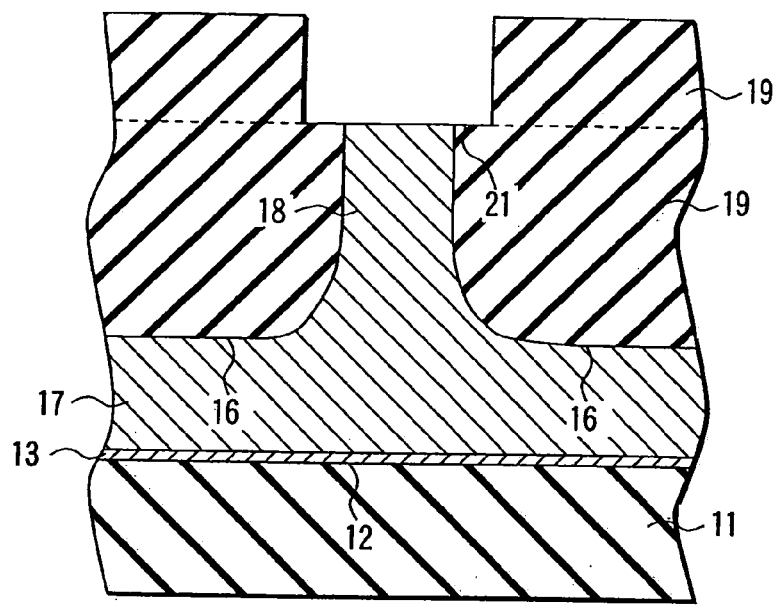
FIG. 20 is a cross-sectional view showing a step of manufacturing the semiconductor device according to the third embodiment of the present invention, which is subsequent to the step shown in FIG. 19.

As illustrated in FIG. 20, the third insulating film 19 is flattened by CMP and the surface of the second insulating film 55 is exposed. After that, the second insulating film 55 is eliminated by HF and the surface of the via section 18 is exposed. As a result, a third groove 21 is formed in the third insulating film 19 and on the via section 18.

Figure 21:
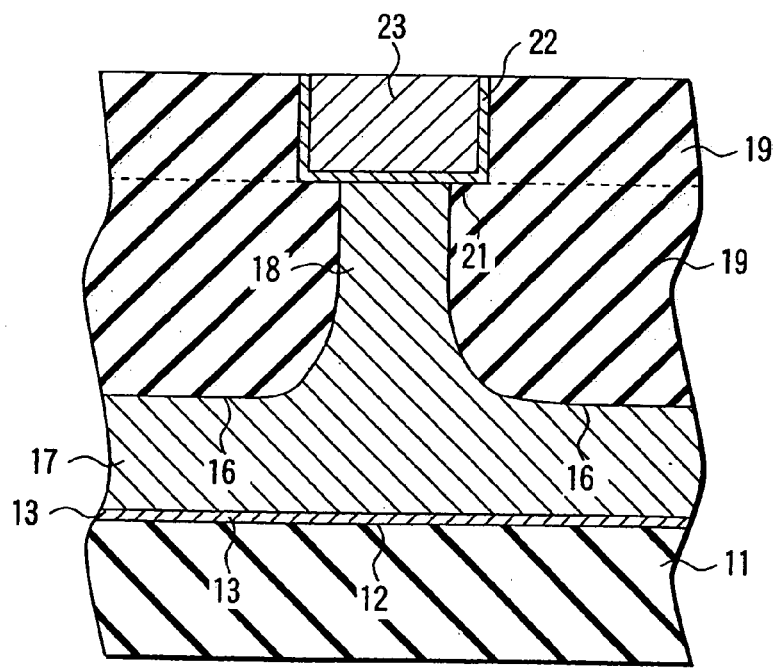
FIG. 21 is a cross-sectional view showing a step of manufacturing the semiconductor device according to the third embodiment of the present invention, which is subsequent to the step shown in FIG. 18.
Figure 22:
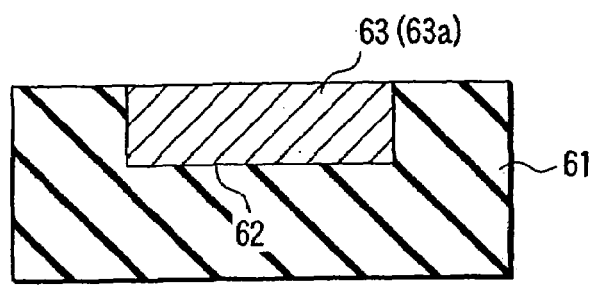
FIGS. 22, 23, 24 and 25 are cross-sectional views each showing a step of manufacturing a prior art semiconductor device.
Figure 23:
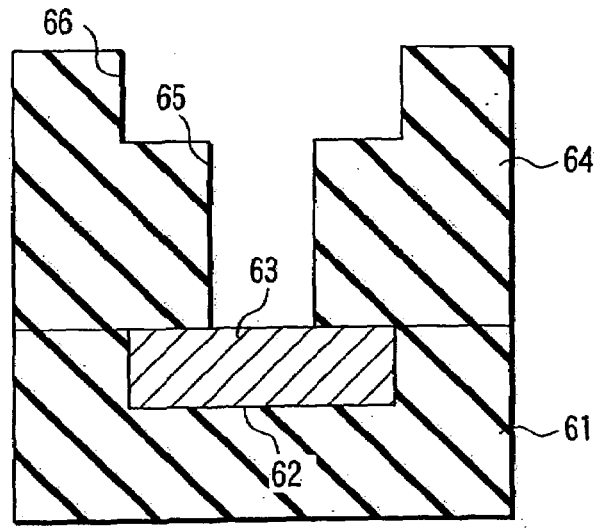
Figure 24:
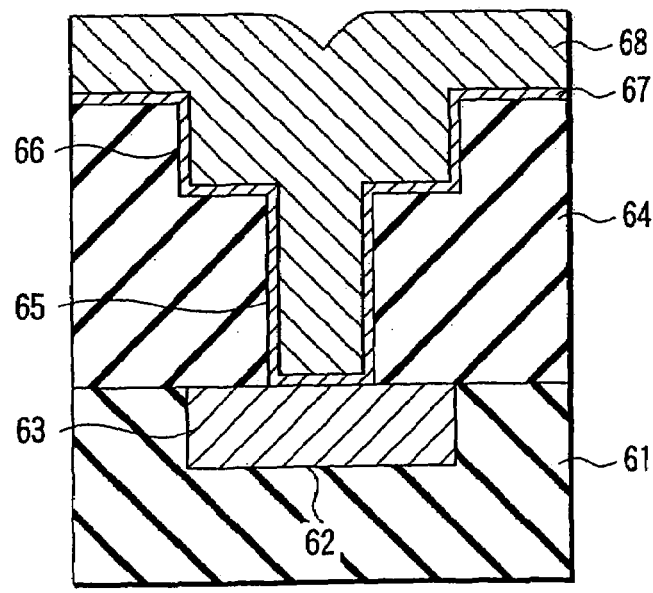
Figure 25:
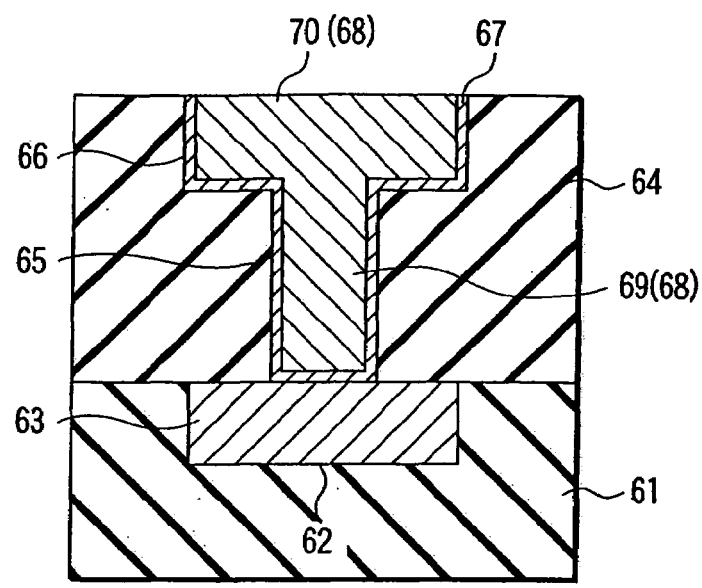
Figure 26:
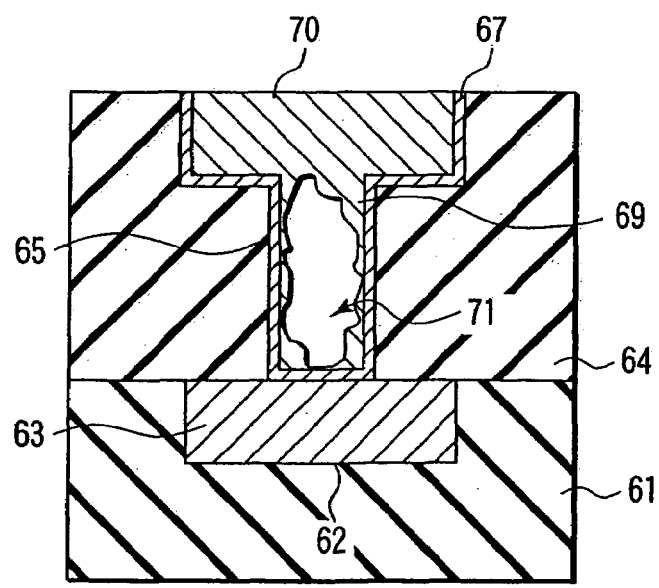
FIG. 26 is a cross-sectional view of a void formed in the prior art semiconductor device

As shown in FIG. 21, a second wiring layer 23 is formed in the third groove 21 with a barrier metal layer 22 interposed therebetween. The second wiring layer 23 is therefore electrically connected to the first wiring layer 17 through the via section 18.

The foregoing third embodiment can produce the same advantage as that of the first embodiment.

The second insulating film 55 used as a mask in forming the via section 18 is used as a dummy pattern for forming the second wiring layer 23. Consequently, the number of manufacturing steps in the third embodiment can be made smaller than that in the first embodiment.

The second insulating film 55 is formed of materials other than those of the first insulating film 11. Thus, the second insulating film 55 can be removed selectively and easily from the first insulating film 11 before the second wiring layer 23 is formed.

The third embodiment can be applied to the second embodiment. In this case, the same advantage as those of the second and third embodiments can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
a first wiring layer formed above the semiconductor substrate and running in a first direction;
a second wiring layer formed above the first wiring layer and the semiconductor substrate; and
a connecting portion for extending upward from a portion of an upper surface of the first wiring layer and configured to electrically connect the first and second wiring layers, the connecting portion being a width in the first direction smaller than a width of the first wiring layer in the first direction, a bottom portion of the connecting portion being curved, the connecting portion and the first wiring layer being formed of a same layer and the connecting portion and the second wiring layer being formed of different layers.

2. The semiconductor device according to claim 1, wherein a width of the connecting portion in a second direction which is perpendicular to the first direction is equal to a width of the first wiring layer in the second direction.

3. The semiconductor device according to claim 1, wherein the connecting portion has an opening with dimensions or smaller than minimum process dimensions of a width of the second wiring layer.

4. The semiconductor device according to claim 1, wherein the second wiring layer is formed opposite to the first wiring layer.

5. A semiconductor device comprising:
a semiconductor substrate;
a first wiring layer formed above the semiconductor substrate and running in a first direction;
a second wiring layer formed above the first wiring layer and the semiconductor substrate; and
a connecting portion extending upward from a portion of an upper surface of the first wiring layer and configured to electrically connect the first and second wiring layers, the connecting portion having an opening with dimensions smaller than minimum process dimensions of a width of the second wiring layer, the connecting portion having a width in the first direction smaller than a width of the first wiring layer in the first direction, the connecting portion and the first wiring layer being formed of a same layer, and the connecting portion and the second wiring layer being formed of different layers.

6. The semiconductor device according to claim 5, wherein a bottom portion of the connecting portion is curved.

7. The semiconductor device according to claim 6, wherein a width of the connecting portion in a second direction which is perpendicular to the first direction is equal to a width of the first wiring layer in the second direction.

8. The semiconductor device according to claim 5, wherein the second wiring layer is formed opposite to the first wiring layer.

9. The semiconductor device according to claim 5, further comprising:
a first insulating film,
a groove formed in the first insulating film, the first wiring layer and the connecting portion being disposed in the groove; and
a second insulating film formed on the first insulating film and a surface of the first wiring layer in the groove, a surface of the second insulating film having substantially the same height as a surface of the second wiring layer.

10. The semiconductor device according to claim 9, wherein the first insulating film is formed of an oxide film and the second insulating film is formed of an organic film.

11. A semiconductor device comprising:
   a semiconductor substrate;
   a first wiring layer formed above the semiconductor substrate and running in a first direction,
   a second wiring layer formed above the first wiring layer and the semiconductor substrate:
   a connecting portion extending upward from a portion of an upper surface of the first wiring layer and configured to electrically connect the first and second wiring layers, the connecting portion having a width in the first direction smaller than a width of the first wiring layer in the first direction, a bottom portion of the connecting portion being curved, the connecting portion and the first wiring layer being formed of a same layer and the connecting portion and the second wiring layer being formed of different layers;
   a first insulating film;
   a groove formed in the first insulating film, the first wiring layer and the connecting portion being disposed in the groove; and
   a second insulating film formed on an upper surface of the first wiring layer in the groove, the first and second insulating films being different from each other.

12. The semiconductor device according to claim 11, wherein the first insulating film is formed of an oxide film and the second insulating film is formed of an organic film.

* * * * *